US008008649B2

(12) United States Patent
Register, II et al.

(10) Patent No.: US 8,008,649 B2
(45) Date of Patent: Aug. 30, 2011

(54) INCORPORATING GATE CONTROL OVER A RESONANT TUNNELING STRUCTURE IN CMOS TO REDUCE OFF-STATE CURRENT LEAKAGE, SUPPLY VOLTAGE AND POWER CONSUMPTION

(75) Inventors: Leonard Franklin Register, II, Round Rock, TX (US); Sanjay Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 50 days.

(21) Appl. No.: 12/370,844

(22) Filed: Feb. 13, 2009

(65) Prior Publication Data

US 2010/0207101 A1 Aug. 19, 2010

(51) Int. Cl.
*H01L 21/335* (2006.01)
*H01L 29/66* (2006.01)

(52) U.S. Cl. . 257/24; 257/25; 257/E21.4; 257/E29.168; 438/285

(58) Field of Classification Search ............ 257/9–39, 257/E29.168, E29.042, E29.179, E39.003, 257/E39.012–E39.015, E21.4, 190, 617, 257/E29.068, E29.34, E29.341; 438/285, 438/142, 197, 268, 299
See application file for complete search history.

(56) References Cited

U.S. PATENT DOCUMENTS

| | | | | | |
|---|---|---|---|---|---|
| 4,721,983 | A | * | 1/1988 | Frazier | 257/24 |
| 4,959,696 | A | * | 9/1990 | Frensley et al. | 257/15 |
| 5,552,330 | A | * | 9/1996 | Tehrani et al. | 438/172 |
| 6,218,677 | B1 | * | 4/2001 | Broekaert | 257/22 |
| 7,002,175 | B1 | | 2/2006 | Singh et al. | 257/25 |
| 7,465,953 | B1 | * | 12/2008 | Koh et al. | 257/9 |
| 2004/0209416 | A1 | * | 10/2004 | Holonyak et al. | 438/200 |
| 2008/0073641 | A1 | * | 3/2008 | Cheng et al. | 257/25 |
| 2009/0127542 | A1 | * | 5/2009 | Sugaya et al. | 257/24 |

OTHER PUBLICATIONS

Seong Jin Koh Strategies for Controlled Placement of Nanoscale Building Blocks, Nanoscale Research Letters vol. 2, No. 11, pp. 519-545 Published online: Oct. 9, 2007.*
Woodward, et al., "Integration of a Resonant-Tunneling Structure with a Metal-Semiconductor Field-Effect Transistor," Appl. Phys. Lett. 51, 1542-1544 (1987).
Chou, et al., "Observation of Electron Resonant Tunneling in a Lateral Dual-Gate Resonant Tunneling Field-Effect Transistor," Appl. Phys. Lett. 55, 176-178 (1989).

(Continued)

*Primary Examiner* — Matthew Smith
*Assistant Examiner* — Walter H Swanson
(74) *Attorney, Agent, or Firm* — Robert A. Voigt, Jr.; Winstead P.C.

(57) ABSTRACT

A semiconductor device and method for fabricating a semiconductor device incorporating gate control over a resonant tunneling structure. The semiconductor device includes a source terminal, a gate terminal, a drain terminal, and a resonant tunneling structure located beneath or adjacent to the gate terminal, where the gate terminal controls an electrostatic potential drop through the resonant tunneling structure as well as controlling a potential within a portion of the conduction channel immediately beneath the gate terminal as in a MOSFET. The semiconductor device is fabricated by growing epitaxial layers of tunnel barriers and quantum wells, where a quantum well is formed between each set of two tunneling barriers. Additionally, the epitaxial layers of tunnel barriers and quantum wells are grown, etched and patterned to form a resonant tunneling structure. Further, the semiconductor device is grown, etched and patterned to form a gate, source and drain electrode.

29 Claims, 10 Drawing Sheets

OTHER PUBLICATIONS

Ismail, et al., "Lateral Resonant Tunneling in a Double-Barrier Field Effect Transistor," Appl. Phys. Lett., 55, 589-591 (1989).

Ismail, et al., "A Planar Resonant Tunneling Field Effect Transistor," IEEE Trans. Elec. Devices 36, 2617 (1989).

Yang, et al., "Analysis of the Performance of the Quantum Wire Resonant Tunneling Field-Effect Transistor," Superlattices and Microstructures vol. 27, 245-254 (2000).

Yen, et al., "Monolithic Integrated Resonant Tunneling Diode and Heterostructure Junction Field Effect Transistor Circuits," Solid-State Electronics vol. 39, 1449-1455 (1996).

Register, et al., "Resonant-Injection-Augmented Field-Effect Transistor for Low-Voltage Switching" at the 4th International Nanotechnology Conference, Tokyo, Japan, Apr. 14-17, 2008.

* cited by examiner

INCORPORATING GATE CONTROL OVER A RESONANT TUNNELING STRUCTURE IN CMOS TO REDUCE OFF-STATE CURRENT LEAKAGE, SUPPLY VOLTAGE AND POWER CONSUMPTION

TECHNICAL FIELD

The present invention relates to transistors, and more particularly to incorporating gate control over a resonant tunneling structure in devices similar to Metal-Oxide-Semiconductor Field-Effect Transistors (MOSFETs) to reduce the off-state current leakage, supply voltage and power consumption.

BACKGROUND OF THE INVENTION

A Field-Effect Transistor (FET) is a type of transistor that relies on an electric field to control conduction of charge carriers through a conduction channel, for either negatively charged electrons in n-channel devices or positively charged holes in p-channel devices. One common type of field-effect transistor is a Metal-Oxide-Semiconductor Field-Effect Transistor (MOSFET), with an n-channel device called an nMOSFET (or simply NMOS) and a p-channel device called a pMOSFET (or simply pMOS). Complementary Metal-Oxide-Semiconductor (CMOS) is a class of integrated circuits that uses combinations of pMOSFETs and nMOSFETs to achieve logic functions.

In a MOSFET, the applied voltage on the gate electrode controls electrical current flow between a source terminal and a drain terminal via electrostatic control of the height of the conduction band edge energy within the channel (which extends between the source and the drain) in n-channel devices, or the valence band edge in p-channel devices. The "threshold" voltage is the rough point of switching the transistor between the active or ON state and the de-active or OFF state. For instance, in an nMOSFET, when the gate voltage exceeds the threshold voltage, electrons from the source (and possibly also the drain) enter the conducting channel. Current is conducted through the channel when a voltage is applied between the source and the drain. In this scenario, the nMOSFET may be said to be in the ON state. For gate voltages below the threshold value, the channel is lightly populated with electrons, and a very small current, referred to as the leakage current or subthreshold leakage current, can flow between the source and the drain. In this scenario, the nMOSFET may be said to be in the OFF state. In this manner, the transistor switches between an ON state and an OFF state.

However, switching between the ON and OFF states is not entirely abrupt. At best, the current can be reduced only by one order of magnitude for every 2.3 $k_BT/q$ (natural log of 10 times Boltzmann's constant ($k_B$) times temperature (T) in degrees Kelvin all divided by the magnitude of the charge of an electron (q)) which is 60 mV at approximately room temperature (300 degrees Kelvin) when the transistor is switched to the OFF state. This limit is a result of "thermionic emission" of energetic charge carriers from the high energy tail of the carrier energy distribution in the source into the channel. The thermionically-emitted charge carriers represent a critical leakage path (leakage current) for MOSFETs in the OFF state. Thermionic emission is a basic physical mechanism of transport in a MOSFET and cannot be eliminated by changing device materials, the device geometry or the overall size of the device.

In attempting to minimize power consumption in CMOS logic employing MOSFETs, where the transistors are only switching for a very small fraction of the time on average and otherwise remain in a steady-state condition, transistor ON-OFF current ratios of multiple orders of magnitude (multiple factors of ten) still must be achieved to control OFF-state power consumption. To achieve these ratios subject to the optimal 2.3 $k_BT/q$ per decade switching and to also provide enough ON-state current for sufficiently rapid switching, an approximate half a volt change in the gate voltage between the ON and OFF states is required. However, the energy consumed during switching varies as the square of the supply voltage. Thus, historically, as device density has increased in logic circuits, not only have device dimensions been reduced, but also supply voltages. However, the inability to further scale supply voltages for MOSFETs beyond the point discussed above represents a major determent to the continued improvement in the computational capabilities and energy efficiency of future logic circuits employing MOSFETs.

If, however, field effect transistors could be adapted to have greater gate control over the current in the channel, such that even charge carriers with enough energy to reach the portion of the conduction channel beneath the gate will nevertheless be reflected back to the source in the OFF state, the limits of thermionic emission could be overcome thereby allowing reduction of the supply voltage and power consumption.

BRIEF SUMMARY OF THE INVENTION

In one embodiment of the present invention, a semiconductor device comprises a source terminal, a gate terminal, a drain terminal, and a resonant tunneling structure located beneath or adjacent to the gate terminal within a current conduction path. The resonant tunneling structure comprises one or more quantum wells and tunneling barriers. The gate terminal controls an electrostatic potential drop through the resonant tunneling structure largely independent of drain voltage. Further, the gate terminal controls a potential within a portion of the conduction channel immediately beneath the gate terminal.

In one embodiment of the present invention, a method for fabricating a semiconductor device comprises growing an epitaxial metallic layer, an epitaxial semi-metallic layer or an epitaxial doped semiconductor layer to form an electric-field screening layer on a substrate beneath a resonant tunneling structure. The method further comprises growing epitaxial layers of tunnel barriers and one or more quantum wells on the screening layer, where a quantum well is formed between each set of two tunneling barriers. Furthermore, the method comprises depositing an insulating material on a top tunneling barrier. Additionally, the method comprises etching and patterning the epitaxial layers of tunnel barriers and one or more quantum wells to form the resonant tunneling structure in a shape of a step. Further, the method comprises etching and patterning the semiconductor device to form a gate electrode on the insulating material. In addition, the method comprises etching and patterning the semiconductor device to form a source electrode and a drain electrode on extensions of selected one or more quantum wells serving as source and drain, respectively.

In another embodiment of the present invention, a method for fabricating a semiconductor device comprises growing an epitaxial metallic layer, an epitaxial semi-metallic layer or an epitaxial doped semiconductor layer to form an electric-field screening layer on a substrate beneath a resonant tunneling structure. The method further comprises growing epitaxial layers of tunnel barriers and one or more quantum wells on the screening layer, where a quantum well is formed between each set of two tunneling barriers. Additionally, the method comprises depositing an insulating material on a top tunneling barrier. Furthermore, the method comprises etching and patterning the epitaxial layers of tunnel barriers and one or more quantum wells to form the resonant tunneling structure in a shape of a step. In addition, the method comprises etching and patterning the semiconductor device to form a gate electrode on the insulating material. Further, the method comprises etching and patterning the semiconductor device to form a source electrode and a drain electrode on extensions of selected one or more quantum wells.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWING

A better understanding of the present invention can be obtained when the following detailed description is considered in conjunction with the following drawings, in which.

DETAILED DESCRIPTION OF THE INVENTION

Figure 1A:
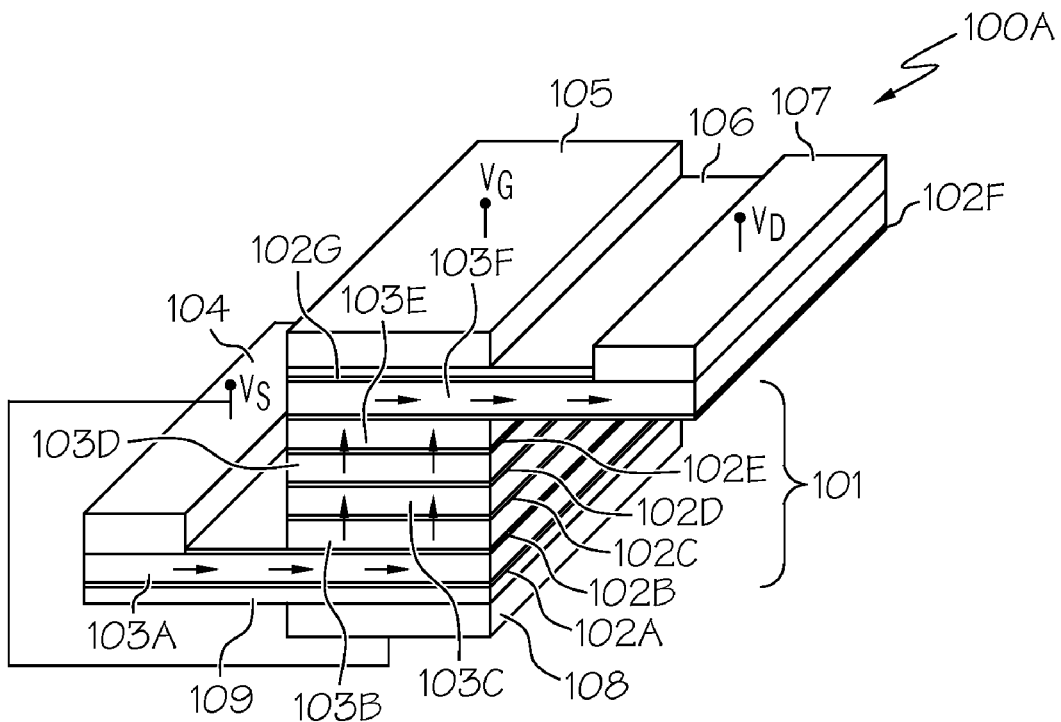
FIGS. 1A-F illustrate various embodiments of a transistor incorporating a resonant tunneling structure in a device similar to a MOSFET in accordance with an embodiment of the present invention.

The present invention comprises a semiconductor device and a method for fabricating a semiconductor device incorporating gate control over a resonant tunneling structure within the current conduction path. In one embodiment of the present invention, the semiconductor device includes a source terminal, a gate terminal, a drain terminal, and a resonant tunneling structure located beneath or adjacent to the gate terminal within the current conduction path, where the gate terminal controls an electrostatic potential drop through the resonant tunneling barrier largely independent of drain voltage. As a result, the charge transport through the resonant tunneling structure is largely independent of the drain terminal voltage. This gate control over resonant tunneling is in addition to the mechanism of gate control in a MOSFET (gate terminal controlling the raising and lowering of the portion of the conduction channel potential immediately beneath the gate) such that better gate control of sub-threshold currents can be achieved than with either mechanism alone. In one embodiment of the present invention, the semiconductor device is fabricated by growing an epitaxial metallic, semimetallic or doped semiconductor layer on a substrate to form an electric-field screening layer beneath the resonant tunneling structure and electrically connected to the source terminal to terminate (screen out) electric fields at or near its surface. Further, an initial epitaxial charge transport barrier is optionally deposited on the epitaxial screening layer. Additionally, epitaxial layers of tunnel barriers and quantum wells are grown on the screening layer, or, if present, on the initial charge transport barrier, where a quantum well is formed between each set of two tunneling barriers. As the source terminal and epitaxial screening layer are electrically connected, the optional initial transport barrier in this embodiment serves only to strengthen the quantum confinement within the bottom well of the resonant tunneling structure. Furthermore, insulating material is deposited on a top tunneling barrier. Additionally, the epitaxial layers of tunnel barriers and quantum wells are etched and patterned to form a resonant tunneling structure in the shape of a step. Further, the semiconductor device is etched and patterned to form a gate electrode on the insulating material as well as to form a source and a drain electrode.

While the following discusses the present invention in connection with CMOS devices, the principles of the present invention may be applied to other classes of integrated circuits. Embodiments covering such permutations would fall within the scope of the present invention.

As discussed in the Background section, in attempting to minimize power consumption in CMOS logic employing MOSFETs, where the transistors are only switching for a very small fraction of the time on average, transistor ON-OFF current ratios of multiple orders of magnitude (multiple factors of ten) still must be achieved to control OFF-state power consumption. To achieve these ratios subject to the optimal $2.3 k_B T/q$ (natural log of 10 times Boltzmann's constant times temperature in degrees Kelvin all divided by the magnitude of the charge of an electron) per decade switching and to also provide enough ON-state current for sufficiently rapid switching, an approximate half a volt change in the gate voltage between the ON and OFF states is required. However, the energy consumed during switching varies as the square of the supply voltage. Thus, historically, as device density has increased in logic circuits, not only have device dimensions been reduced, but also supply voltages. However, the inability to further scale supply voltages for MOSFETs beyond the point discussed above represents a major determent to the continued improvement in the computational capabilities and energy efficiency of future logic circuits employing MOSFETs. If, however, field effect transistors could be adapted to have greater gate control over the current in the channel, such that even charge carriers with enough energy to reach the portion of the conduction channel immediately beneath the gate will nevertheless be reflected back to the source in the OFF state, the limits of thermionic emission could be overcome thereby reducing the supply voltage and power consumption.

Figure 2A:
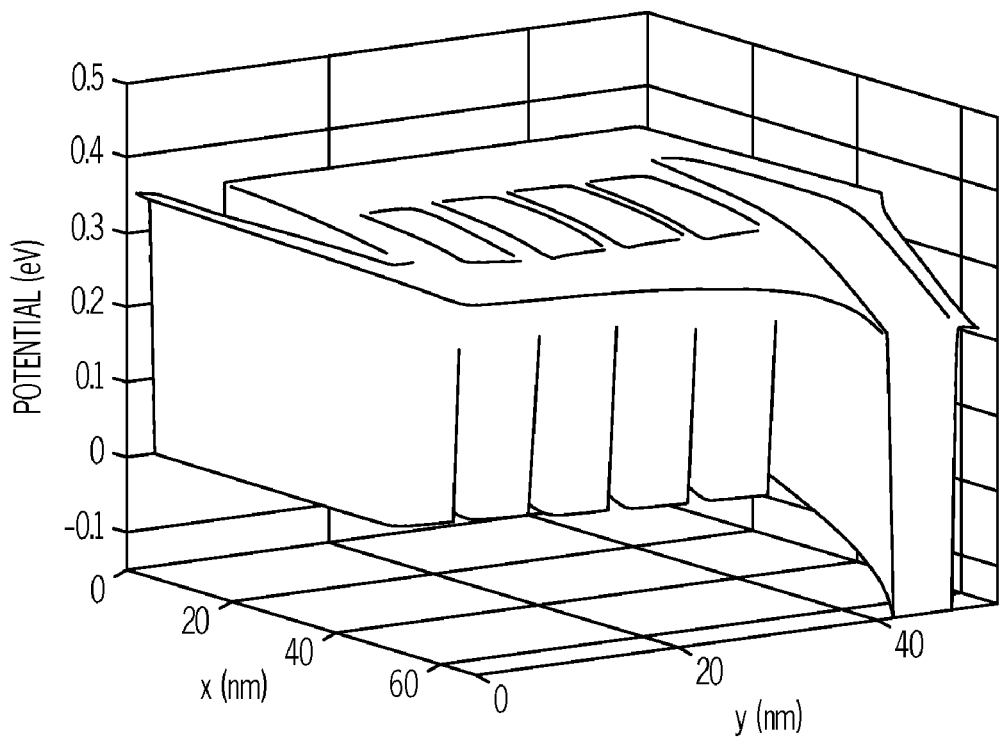
FIGS. 2A-B illustrate a potential structure for a simulated n-channel device that is consistent with the design of the semiconductor device of FIG. 1A in both the ON and OFF states in accordance with an embodiment of the present invention.
Figure 2B:
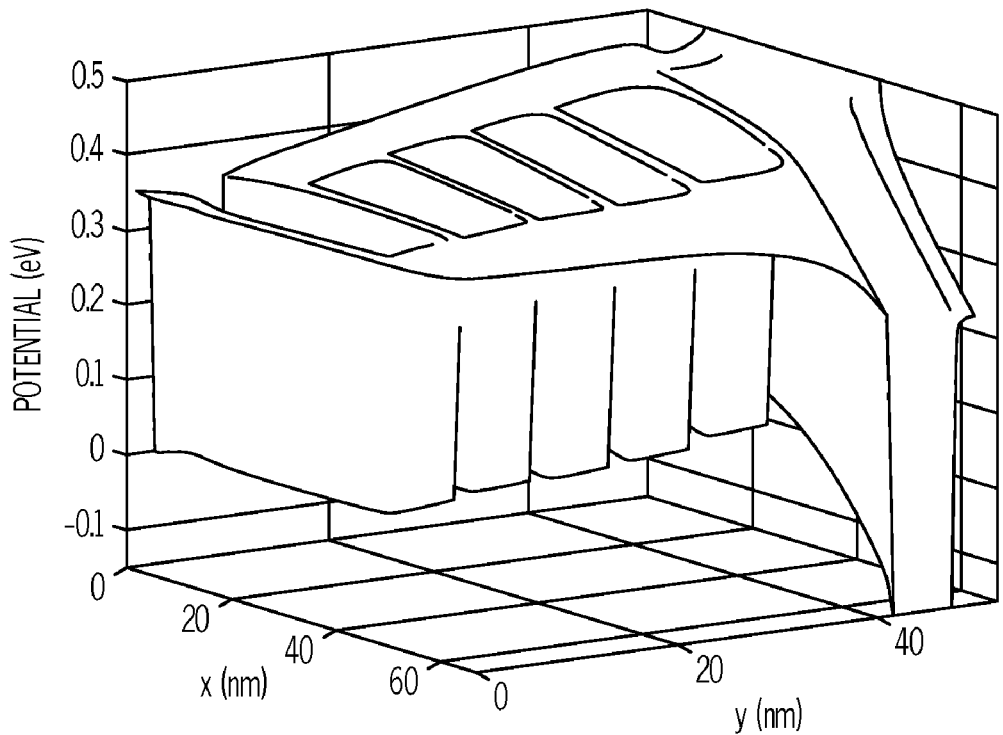
Figure 3:
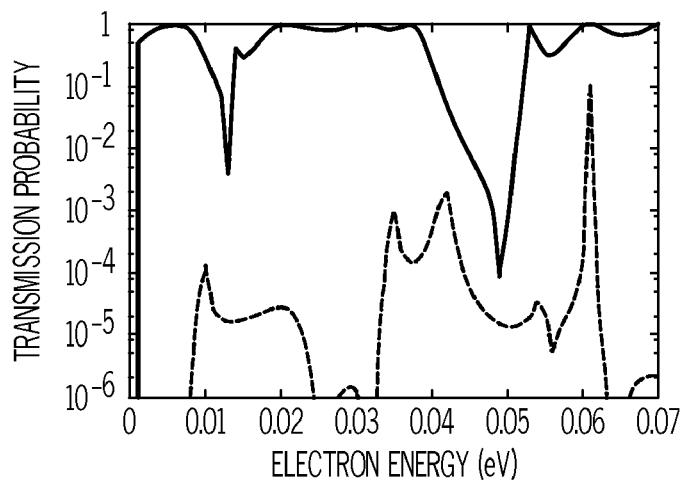
FIG. 3 illustrates the transmission possibilities for the semiconductor device of FIG. 1A in both the ON and OFF states in accordance with an embodiment of the present invention.
Figure 4A:
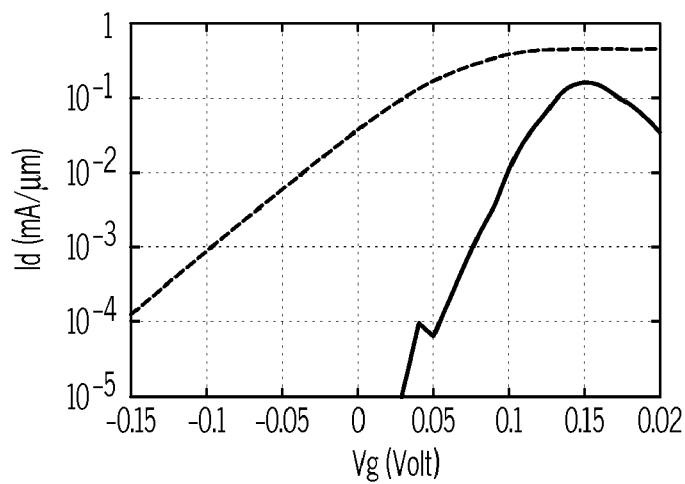
FIGS. 4A-B illustrate the drain current versus gate voltage for the semiconductor device of FIG. 1A in both the logarithmic scale and the linear scale in accordance with an embodiment of the present invention.
Figure 4B:
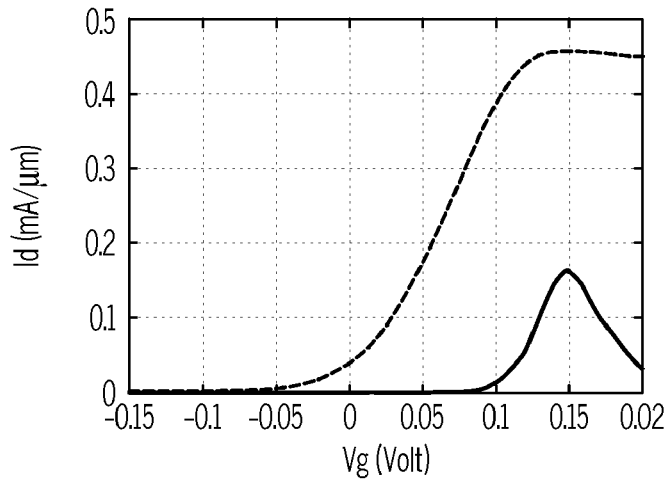
Figure 5:
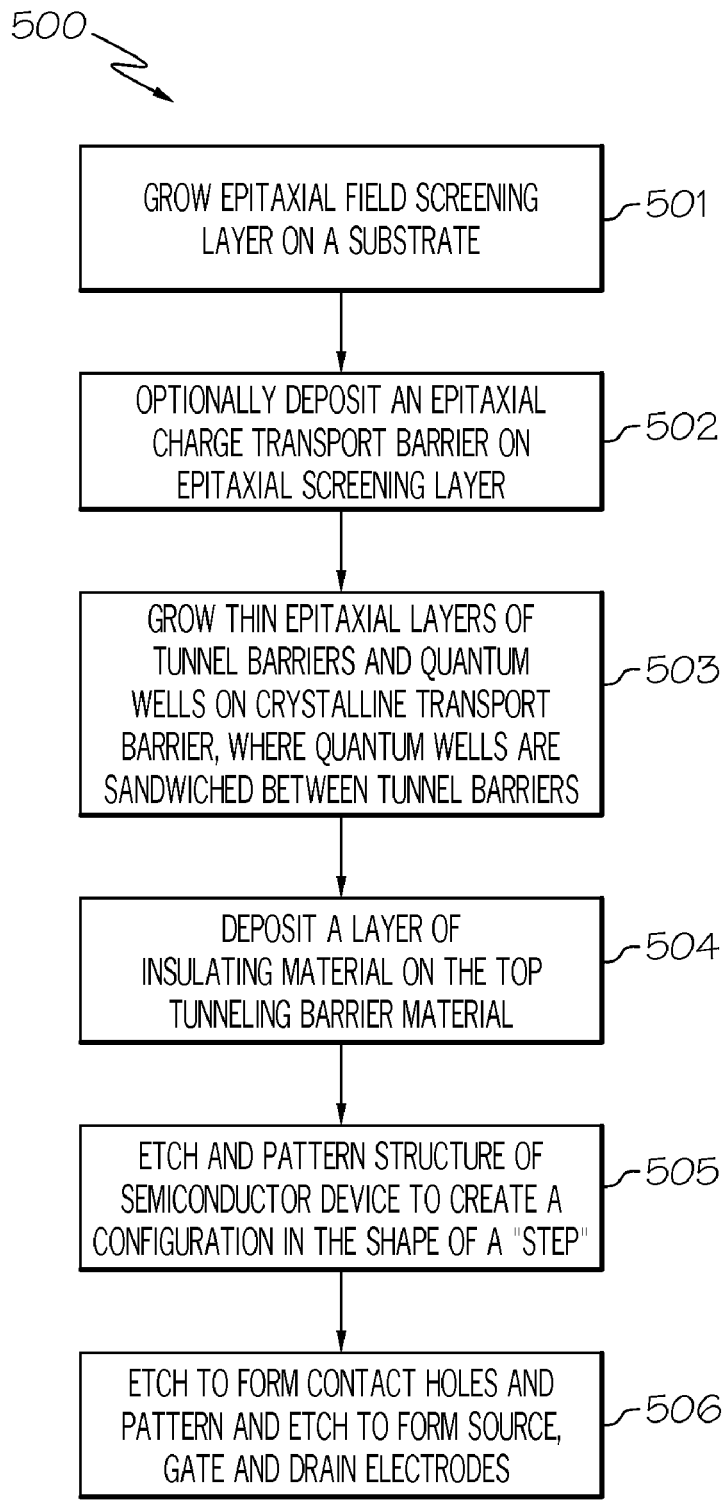
FIG. 5 is a flowchart of a method for fabricating the semiconductor device of FIG. 1A in accordance with an embodiment of the present invention.

By incorporating a resonant tunneling structure in a device similar to a MOSFET, additional gate control of the current is provided thereby reducing leakage current. As a result of reducing leakage current, the power supply voltage may be reduced which thereby reduces power consumption. By allowing more energy efficient operation, greater device density and increased computational power may be achieved in CMOS-like logic circuits. A description of such a device is discussed below in connection with FIGS. 1A-F, 2A-B, 3, 4A-B, 5 and 6A-F. FIGS. 1A-F illustrate various embodiments of a transistor incorporating a resonant tunneling structure in a device similar to a MOSFET. FIGS. 2A-B show the potential structure for a simulated n-channel device that is consistent with the design of the semiconductor device of FIG. 1A in both the ON and OFF states. FIG. 3 illustrates the transmission probabilities for the simulated semiconductor device consistent with the semiconductor device of FIG. 1A in both the ON and OFF states. FIGS. 4A-B illustrate the drain current versus gate voltage for the simulated semiconductor device consistent with FIG. 1A in both the logarithmic scale and the linear scale. FIG. 5 is a flowchart of a method for fabricating the semiconductor device of FIG. 1A. FIGS. 6A-F depict cross-sectional views of the semiconductor device during the fabrication steps described in FIG. 5.

As discussed above, by incorporating a resonant tunneling structure in a device similar to a MOSFET, additional gate control of the current is provided thereby reducing leakage current. One embodiment of a semiconductor device incorporating a resonant tunneling structure in a device similar to a MOSFET is shown in FIG. 1A. Referring to FIG. 1A, semiconductor device 100A includes a resonant tunneling structure 101 that includes multiple tunneling barriers 102A-G where a quantum well 103A-F is formed between a set of the multiple tunneling barriers 102A-G. Tunneling barriers 102A-G may collectively or individually be referred to as tunneling barriers 102 or tunneling barrier 102, respectively. Quantum wells 103A-F may collectively or individually be referred to as quantum wells 103 or quantum well 103, respectively.

A resonant tunneling structure 101 employs "resonant tunneling" which refers to the quantum mechanical phenomenon of having multiple potential barriers be nearly transparent for particle transmission at certain energies or energy ranges. Each quantum well layer 103 formed between each set of two tunneling barrier layers 102 may be designed in such a manner, such as based on its width, to support particular quasi-discrete electron or hole confinement energies. When the energy component in the direction of transport through resonant tunneling structure 101 of an electron in the conduction band or a hole in the hole band (roughly the valence band) is brought into alignment with the energy levels of quantum wells 103 formed between each set of two tunneling barriers 102 via an application of a gate terminal voltage, then the potential barriers become nearly transparent and the carriers "tunnel" through resonant tunneling structure 101 as discussed in further detail below.

Alternatively, resonant tunneling structure 101 may include one or more quantum dot wells (a region of material exhibiting three-dimensional quantum confinement) imbedded within a tunnel barrier material or may include one or more quantum wire wells (a region of material exhibiting two-dimensional quantum confinement) imbedded within a tunnel barrier material. In one embodiment, the quantum dots and/or quantum wires are doped.

Semiconductor device 100A may further include a source terminal 104 formed on an extension of the bottom quantum well 103 (e.g., quantum well 103A) of resonant tunneling structure 101 that serves as a source. Further, semiconductor device 100A may include a drain terminal 107 formed on the top of the extension of quantum well 103 (e.g., the extension of quantum well 103F) of resonant tunneling structure 101 that serves as a drain. Additionally, semiconductor device 100A may include a gate terminal 105 formed on an insulating dielectric 106 which is formed on the top tunneling barrier 102 (e.g., tunneling barrier 102G) of resonant tunneling structure 101. As illustrated in FIG. 1A, in one embodiment, resonant tunneling structure 101 is located beneath or adjacent to gate terminal 105 within a current conduction path, where the "current conduction path" refers to the path of current from source 104 to drain 107. In one embodiment, gate terminal 105 controls the electrostatic potential drop through resonant tunneling structure 101. In one embodiment, gate terminal 105 controls a potential within a portion of the conduction channel immediately beneath (e.g., the portion of quantum well 103F beneath) gate terminal 105. A "portion of the conduction channel immediately beneath the gate," as used herein, refers to the portion of the top quantum well 103 lying beneath gate terminal 105. In one embodiment, insulating dielectric 106 is silicon-dioxide. In another embodiment, insulating dielectric 106 is a high-k dielectric (e.g., hafnium oxide).

Semiconductor device 100A may additionally include a metallic or doped region of an epitaxial semiconductor layer 108 to form a metal-like field-screening layer beneath resonant tunneling structure 101 and electrically connected to source terminal 104 to terminate (screen out) electric fields at or near its surface as illustrated in FIG. 1A. Epitaxial screening layer 108 may be separated from resonant tunneling structure 101 via an optional additional charge transport barrier 109 composed of material that has a large positive conduction band-edge energy offset with respect to the conduction band edge of epitaxial screening layer 108 and the material of quantum well 103 in the case of n-channel devices (such as an aluminum-arsenide (AlAs) transport barrier on top of a gallium-arsenide (GaAs) epitaxial screening layer 108) or a negative valence band energy offset in the case of p-channel devices. In one embodiment, epitaxial screening layer 108 may be made from doped III-V compound semiconductor material. In another embodiment, epitaxial screening layer 108 may be made from doped column IV semiconductor material (e.g., silicon, germanium, silicon-germanium). In another embodiment, epitaxial screen layer 108 is a metal or semimetal. In one embodiment, charge transport barrier 109 may be made from III-V compound semiconductor material. In one embodiment, transport barrier 109 is doped.

Referring to FIG. 1A, resonant tunneling structure 101 is configured to channel or tunnel charge carriers, electrons or holes, between source terminal 104 (source of the charge carriers) and drain terminal 107 in a manner as illustrated by the arrows in FIG. 1A. In one embodiment, resonant tunneling structure 101 is located underneath gate terminal 105 as illustrated in FIG. 1A. In one embodiment, gate terminal 105 controls an electrostatic potential drop through resonant tunneling structure 101. While FIG. 1A shows current flowing up to gate terminal 105, current may be flowing in the reverse direction as illustrated in FIG. 1D.

Referring to FIG. 1A, as discussed above, resonant tunneling structure 101 includes multiple tunneling barriers 102 where a quantum well 103 is formed between a set of multiple tunneling barriers 102. Tunneling barriers 102 may be made from III-V semiconductor compound material, such as gallium arsenide (GaAs) and aluminum gallium arsenide (AlGaAs), as well as other compound materials, such as Calcium Fluoride ($CaFl_2$) and silicon-dioxide, as well as be a high-k dielectric. Quantum wells 103 may be made from III-V semiconductor compound material, such as indium-gallium-arsenide (InGaAs) or gallium-arsenide (GaAs) as well as other materials, such as silicon.

In one embodiment of an n-channel device as illustrated in FIG. 1A, tunneling barriers 102 are made from a material that has a positive conduction band-edge energy offset with respect to the conduction band edge of the material of quantum well 103. The material of quantum well 103 enclosed between barriers 102 forms a quantum well that supports discrete electron energy levels in the direction of confinement although these energy levels may be broadened in energy by various processes. When the energy levels of the source and drain quantum wells 103 (e.g., quantum wells 103A and 103F, respectively, of semiconductor device 100A) and the multiple intermediate quantum wells 103 are brought into alignment in energy, charge transport among wells 103 is promoted in a process called resonant tunneling. When the drain voltage bias is higher than the source voltage bias, a net charge current will flow from drain terminal 107 to source terminal 104. That is, negatively charged electrons will flow from source terminal 104 to drain terminal 107 via this resonant tunneling process. When the quantum well energy levels are not aligned, however, interwell transport is attenuated along with the drain-to-source current. The use of multiple wells 103 in this embodiment increases the abruptness and strength of the transition between resonant-assisted transport in the ON state when wells 103 are aligned, and the attenuated transport of the OFF state when wells 103 are misaligned. With multiple quantum wells 103, this process also can be described as forming a high-order band pass filter for the quantum mechanical electron or hole wave-functions in the ON state. The high-order band pass filter is destroyed by gate terminal 105 when the energy levels become sufficiently misaligned in the OFF state. With multiple quantum wells 103, this process also can be described as forming, or at least beginning to form, an energy mini-band from the coupling of the energy levels of the individual wells 103 in the ON state through which electrons propagate. The mini-band is destroyed by gate terminal 105 when the energy levels become sufficiently misaligned in the OFF state.

In one embodiment for p-channel devices, as also illustrated in FIG. 1A, the device structure and essential description of transport are the same as that of the preceding embodiment except that the charge carriers are holes and tunneling barriers 102 are made from a material that has a negative valence band-edge energy offset with respect to the valence band edge of the material of quantum well 103.

Unlike in conventional resonant-tunneling structures, the alignment and misalignment of the quantum well energy levels is predominately controlled by the gate terminal voltage and is largely independent of the drain voltage. Near the gate ON-state gate voltage, resonant tunneling structure 101 is designed to approach transparency over a broad energy range through resonant tunneling, becoming a high-order band-pass filter for the quantum mechanical charge carrier wave-functions in the case of multiple aligned wells 103, to provide high ON-state drive currents. In the OFF state, the inter-well resonances are eliminated by gate terminal 105 and the "injection efficiency" of carriers into and/or through the portion of the conduction channel immediately beneath gate terminal 105 (e.g., the portion of quantum well 103F beneath gate terminal 105) is attenuated. That is, even carriers with enough energy to reach the portion of the conduction channel immediately beneath gate terminal 105, which is already reduced in number in the OFF state, will nevertheless be most probably reflected back to the source beneath source terminal 104 in the OFF state. Hence, an additional mechanism to control the gate current is provided. As elaborated below, better gate control translates to lower voltage circuit operation which thus reduces power consumption.

Figure 1B:
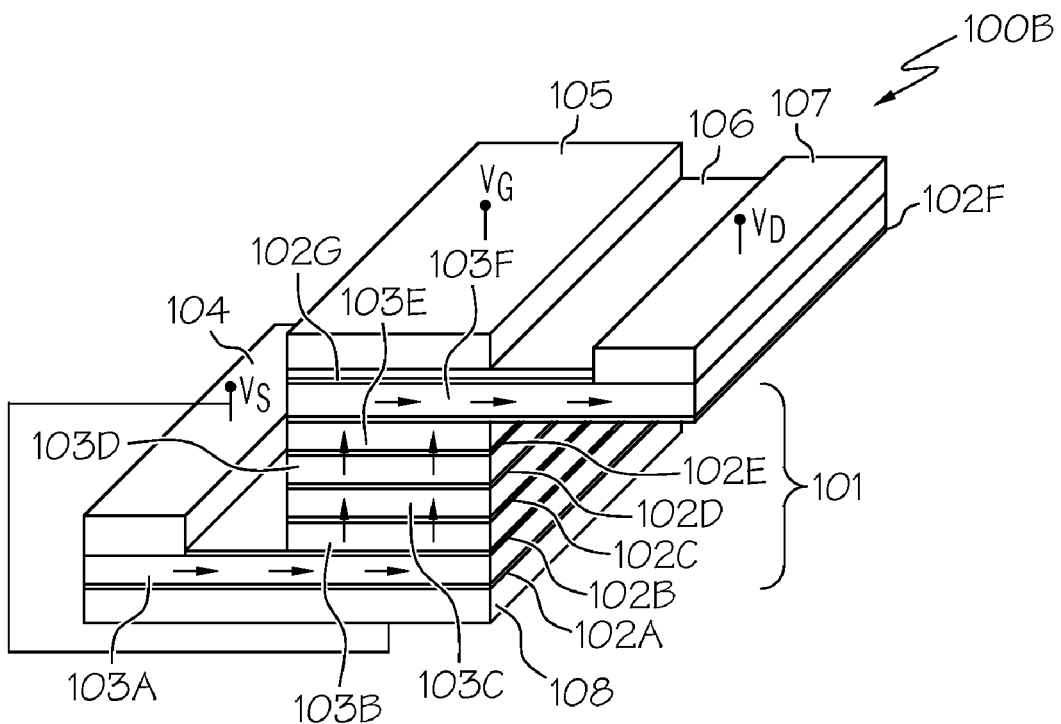

In another embodiment, semiconductor device 100B incorporates a resonant tunneling structure in device similar to a MOSFET as shown in FIG. 1B. Semiconductor device 100B of FIG. 1B differs from semiconductor device 100A of FIG. 1A by eliminating the optional initial transport barrier 109 and by expanding screening layer 108 to cover the entire bottom tunneling barrier 102 (tunneling barrier 102A) as illustrated in FIG. 1B. Semiconductor device 100B includes the same numerals as semiconductor device 100A for the same elements.

Figure 1C:
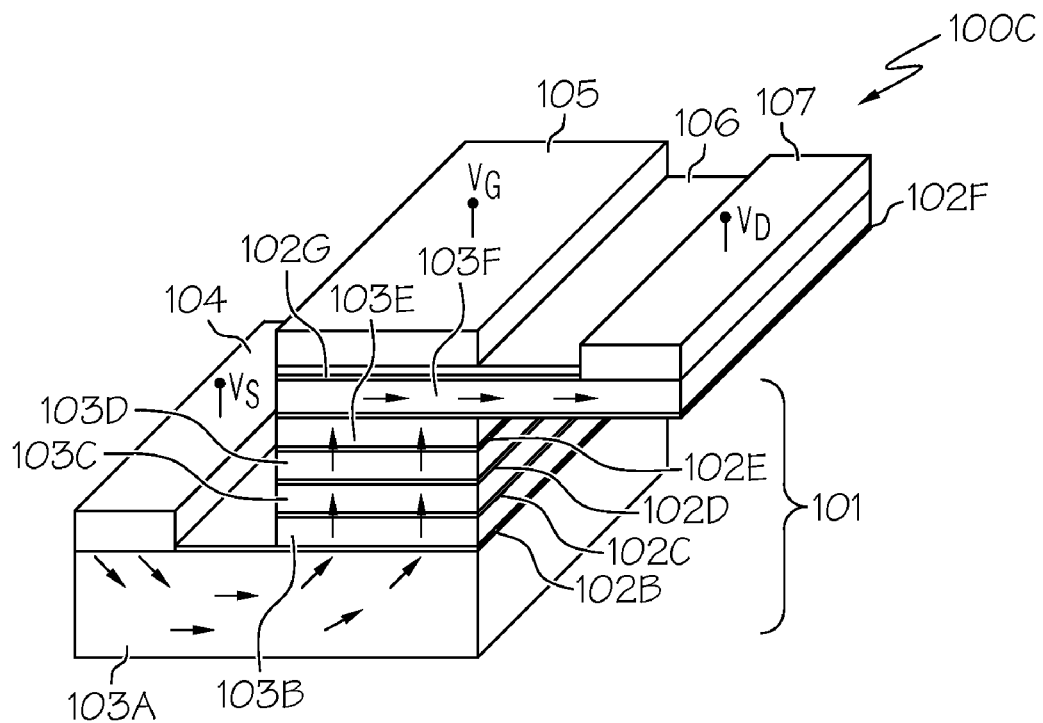
Figure 1D:
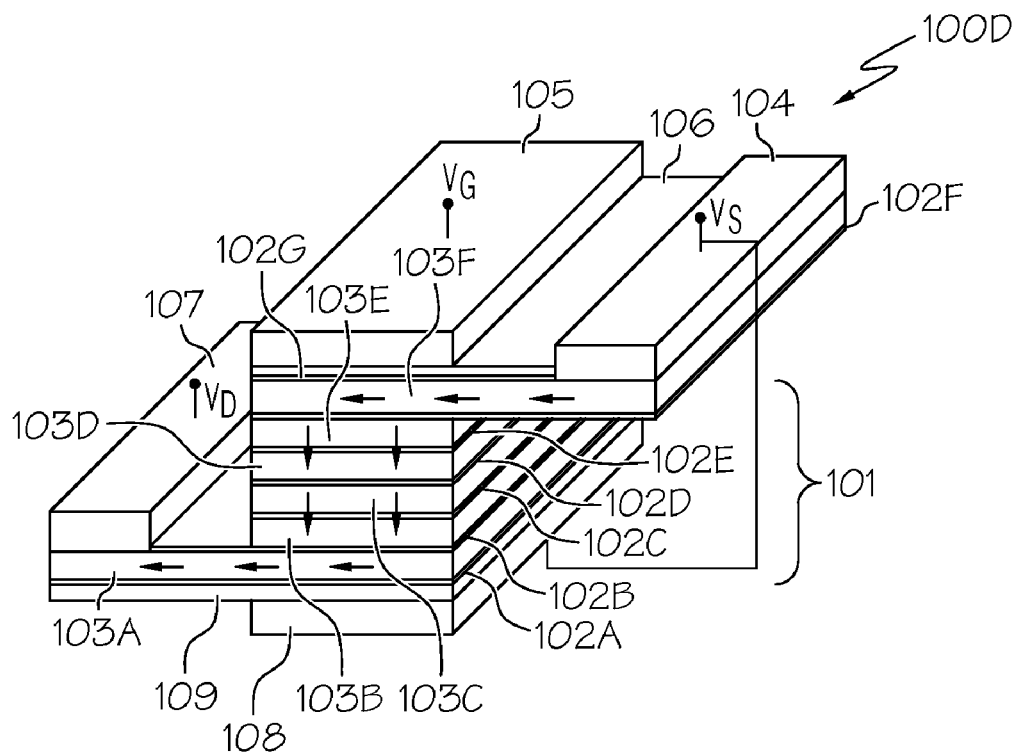

In another embodiment, semiconductor device 100C incorporates a resonant tunneling structure in a device similar to a MOSFET as shown in FIG. 1C. Semiconductor device 100C of FIG. 1C differs from semiconductor device 100A of FIG. 1A by eliminating transport barrier 109, bottom tunneling barrier 102A and separate screening layer 108 and by reducing or eliminating the quantum confinement in layer 103. The electrons may then approach tunneling barrier 102B from a continuum of unconfined energy levels as illustrated in FIG. 1C. Although the source energy levels are not quantum-confined, switching from the OFF state to the ON state is still characterized by gate-controlled creation of a resonant tunneling path for charge carrier flow between source contact 104 and drain contact 107, in addition to the gate-controlled lowering of the portion of the conduction channel potential immediately beneath gate terminal 105 as in a conventional MOSFET. Semiconductor device 100C includes the same numerals as semiconductor device 100A for the same elements.

In another embodiment, semiconductor device 100D incorporates a resonant tunneling structure in a device similar to a MOSFET as shown in FIG. 1D. Semiconductor device 100D of FIG. 1D differs from semiconductor device 100A of FIG. 1A by switching the location of source terminal 104 and the source with the location of drain terminal 107 and the drain and vice-versa, with epitaxial screening layer 108 still electrically connected to source terminal 104 in its new location. As a result, carriers flow in the opposite direction. Semiconductor device 100D includes the same numerals as semiconductor device 100A for the same elements.

Figure 1E:
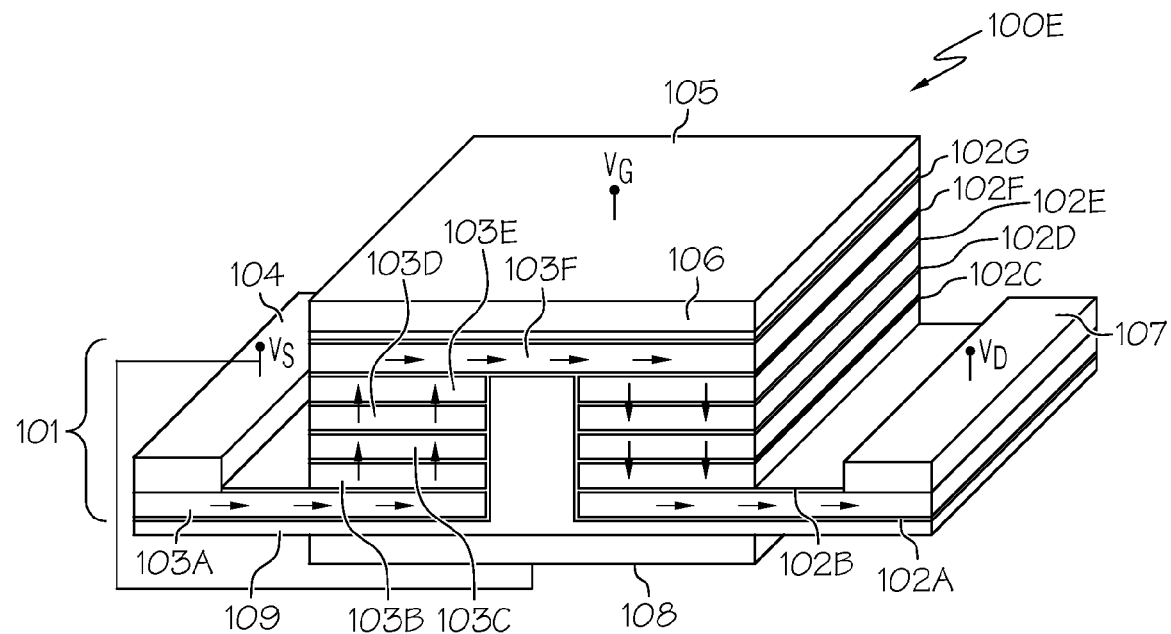

In another embodiment, semiconductor device 100E incorporates a resonant tunneling structure in a device similar to a MOSFET as shown in FIG. 1E. Semiconductor device 100E of FIG. 1E differs from semiconductor device 100A of FIG. 1A by having one resonant tunneling structure 101 between source terminal 104 and gate terminal 105 and one resonant tunneling structure 101 between gate terminal 105 and drain terminal 107. Semiconductor device 100E includes the same numerals as semiconductor device 100A for the same elements.

Figure 1F:
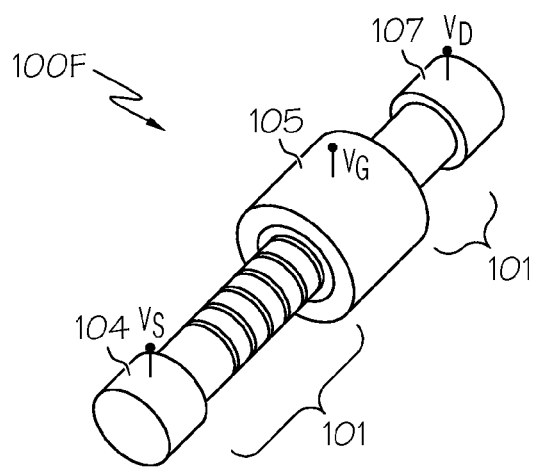

In another embodiment, semiconductor device 100F incorporates a resonant tunneling structure in a device similar to a MOSFET as shown in FIG. 1F. Semiconductor device 100F of FIG. 1F differs from semiconductor device 100A of FIG. 1A by not having the source and drain energy levels being quantum-confined in the direction of transport and by having the barriers of resonant tunneling structure 101 being offset to the side of gate terminal 105. Switching from the OFF state to the ON state is still however characterized by gate-controlled creation of a resonant tunneling path for charge carrier flow between source terminal 104 and drain terminal 107, in addition to the gate controlled lowering of the portion of the conduction channel potential immediately beneath, or alternatively, as surrounded by, gate terminal 105 as in a MOSFET. Carrier motion in the directions normal to transport may or may not be significantly discretized through quantum confinement in these directions. Semiconductor device 100F includes the same numerals as semiconductor device 100A for the same elements.

Referring to FIGS. 2A-B, FIGS. 2A-B illustrate a potential structure for a simulated n-channel device consistent with the basic design of semiconductor device 100A of FIG. 1 in accordance with an embodiment of the present invention where a 150 mV supply voltage was assumed. FIG. 2A is a graph of the potential in electron volts (eV) versus the x and y directions in nanometer lengths, where the source is represented at the left, the gate is represented at the top right and the drain is represented at the bottom right of the graph. FIG. 2A illustrates that a flat-band condition is achieved under a 150 mV gate voltage during an ON state of a simulated semiconductor device consistent with semiconductor device 100A of FIG. 1. FIG. 2B is also a graph of the potential in electron volts (eV) versus the x and y directions in nanometer lengths, where the source is represented at the left, the gate is represented at the top right and the drain is represented at the bottom right of the graph. FIG. 2B illustrates that an OFF state was achieved at 0 mV of gate voltage.

FIG. 3 illustrates the simulated transmission probabilities as a function of electron energy (in eV) referenced to the minimum carrier energy in the conduction channel immediately below the gate (the portion of quantum well 103F below the gate) in the ON and OFF states in accordance with an embodiment of the present invention. The solid line in the graph of FIG. 3 illustrates the results for the ON state; whereas, the dotted line in the graph of FIG. 3 illustrates the results for the OFF state. The minimum carrier energy reference is also being controlled by the gate, such that in the OFF state, not only are the transmission probabilities smaller, but also, as in a MOSFET, there are fewer electrons with energy above this minimum energy required for injection into the portion of the conduction channel immediately below the gate.

FIGS. 4A-B are graphs illustrating the drain current vs. gate voltage for the semiconductor device 100A of FIG. 1A obtained from simulation results in accordance with an embodiment of the present invention. Also shown for comparison are simulation results for a dual-gate III-V MOSFET assuming the same channel (quantum well) width, gate insulator and source and drain doping densities (approximately $10^{18}/cm^3$). FIG. 4A graphs the current using a logarithmic scale to better display subthreshold behavior; whereas, FIG. 4B graphs the current using a linear scale to better display ON-state behavior. The solid line in FIGS. 4A-B represent the simulated results for a semiconductor device consistent with semiconductor device 100A of FIG. 1A. The dotted line in FIGS. 4A-B represents the simulated results for a dual gate III-V MOSFET.

As illustrated in FIGS. 4A-B, there is a much quicker turnoff for the simulated semiconductor device 100A as compared to the MOSFET, where it is noted that the rate of turn-off for the simulated MOSFET—essentially 60 mV change in gate voltage at 300K required to reduce current by one order of magnitude—represents the theoretical limit of performance for MOSFETs. While the current above the threshold for semiconductor device 100A is less than that for the MOSFET, the reduction in current is largely compensated by the reduction in the amount of current required to charge load capacitances for the lower allowed ON-state voltage. Note that the reduction of current for gate voltages beyond the ON-state voltage should be mitigated in structures such as those of FIGS. 1E and 1F, where charge filling of the potential well formed beneath the gate for gate voltages beyond the ON-state voltage will significantly reduce the amount by which the portion of the conduction channel potential immediately below the gate can be pulled below the source potential.

An embodiment of a method for fabricating semiconductor device 100A of FIG. 1A is provided in FIG. 5. FIG. 5 will be discussed in conjunction with FIGS. 6A-F, which depict cross-sectional views of semiconductor device 100A during the fabrication steps described in FIG. 5 in accordance with an embodiment of the present invention.

Figure 6A:
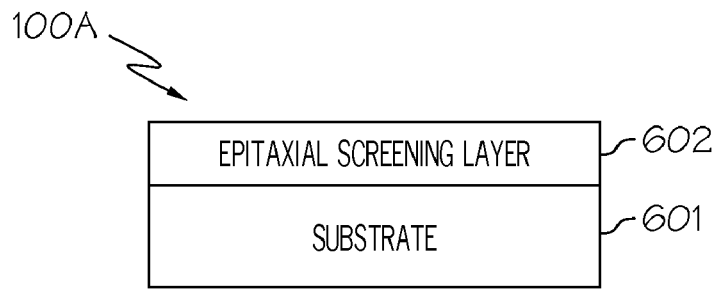
FIGS. 6A-F depict cross-sectional views of the semiconductor device during the fabrication steps described in FIG. 5 in accordance with an embodiment of the present invention.

Referring to FIG. 5, in conjunction with FIGS. 1A and 6A-F, in step 501, an epitaxial layer (e.g., metallic, semi-metallic, doped semiconductor layer) 602 is grown on a substrate 601 (e.g., silicon, gallium arsenide) to form an electric-field screening layer beneath resonant tunneling structure 101 as illustrated in FIG. 6A. In one embodiment, substrate 601 includes III-V compound semiconductor material. In another embodiment, substrate 601 includes column IV semiconductor material (e.g., silicon, germanium, silicon-germanium alloy). Epitaxial screening layer 602, and subsequent layer 603, 102 and 103, may be grown using various methods, such as Molecular Beam Epitaxy (MBE) or with Metal Organic Chemical Vapor Deposition (MOCVD).

Figure 6B:
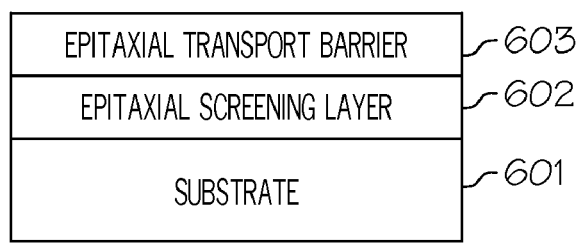

In step 502, an epitaxial transport barrier layer 603 is optionally deposited on epitaxial screening layer 602 as illustrated in FIG. 6B. In one embodiment, transport barrier layer 603 is grown using MBE or MOCVD.

Figure 6C:
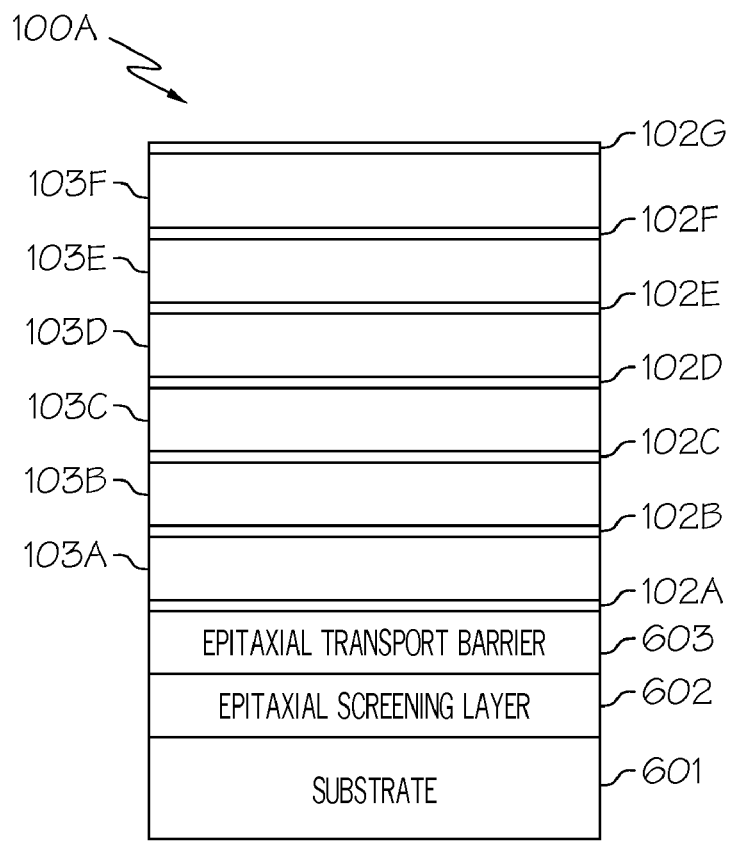

In step 503, thin epitaxial layers of tunnel barriers 102 and quantum wells 103 are grown on epitaxial screening layer 602 (in case where epitaxial barrier layer 603 is not deposited on epitaxial screen layer 602) or epitaxial transport barrier 603, where quantum wells 103 are sandwiched between tunnel barriers 102 as illustrated in FIG. 6C. In one embodiment, tunneling barriers 102 are formed from III-V compound semiconductor materials, such as gallium-arsenide, aluminum-gallium-arsenide. As an illustration, for the simulation of FIGS. 2-4, tunneling barriers 102 were approximately 1.7 nm in thickness and quantum wells 103 were approximately 4.5 nm in thickness. However, these dimensions were subject to the accuracy of the physical model. Furthermore, actual barrier thickness will vary with the embodiment as well. In another embodiment, tunneling barriers are formed from calcium fluoride ($CaF_2$). In one embodiment, quantum wells 103 are formed from silicon.

Figure 6D:
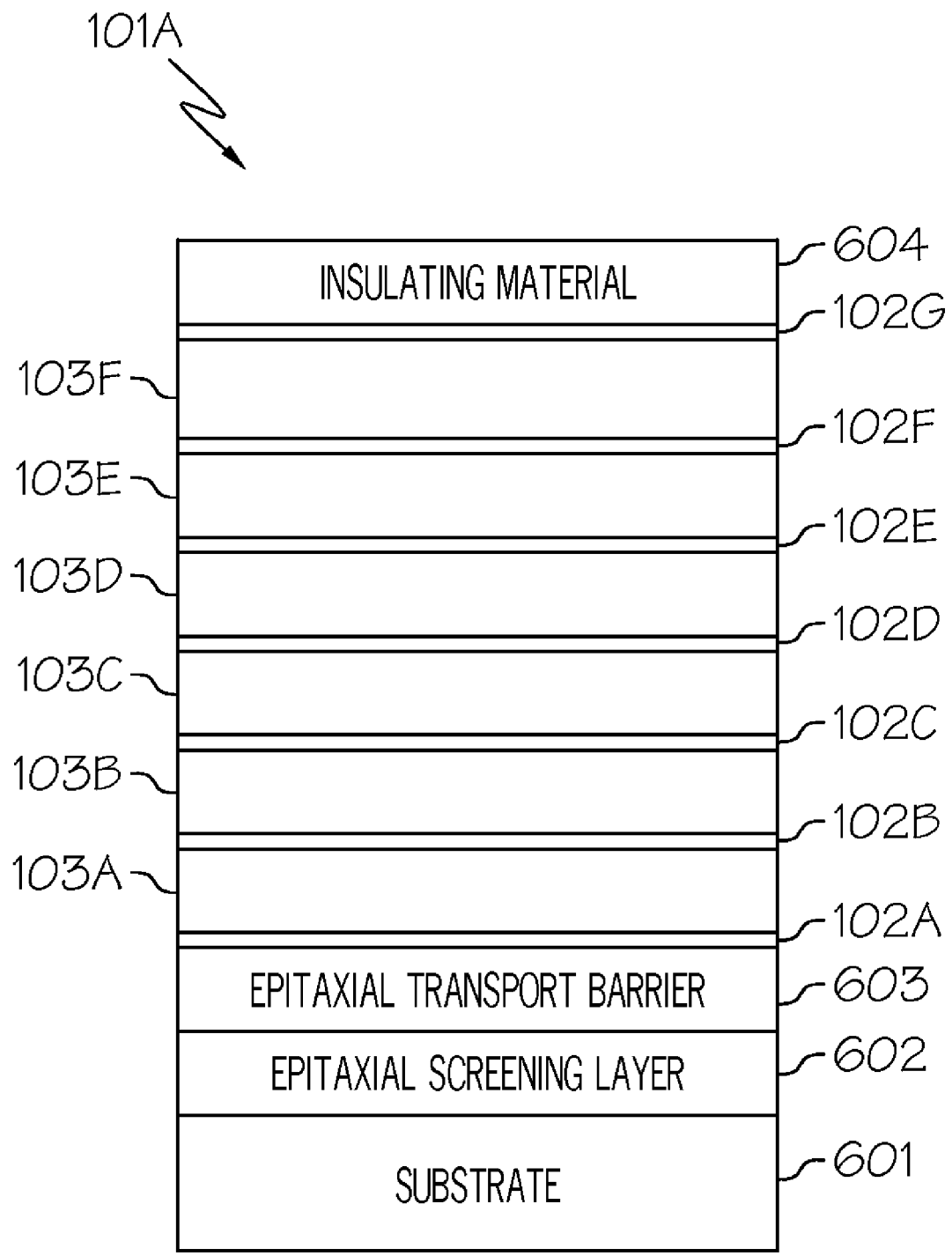

In step 504, a layer of insulating material 604 (e.g., silicon dioxide, high-k dielectrics) is deposited on the top tunneling barrier material 102 (e.g., tunneling barrier 102G) as illustrated in FIG. 6D.

Figure 6E:
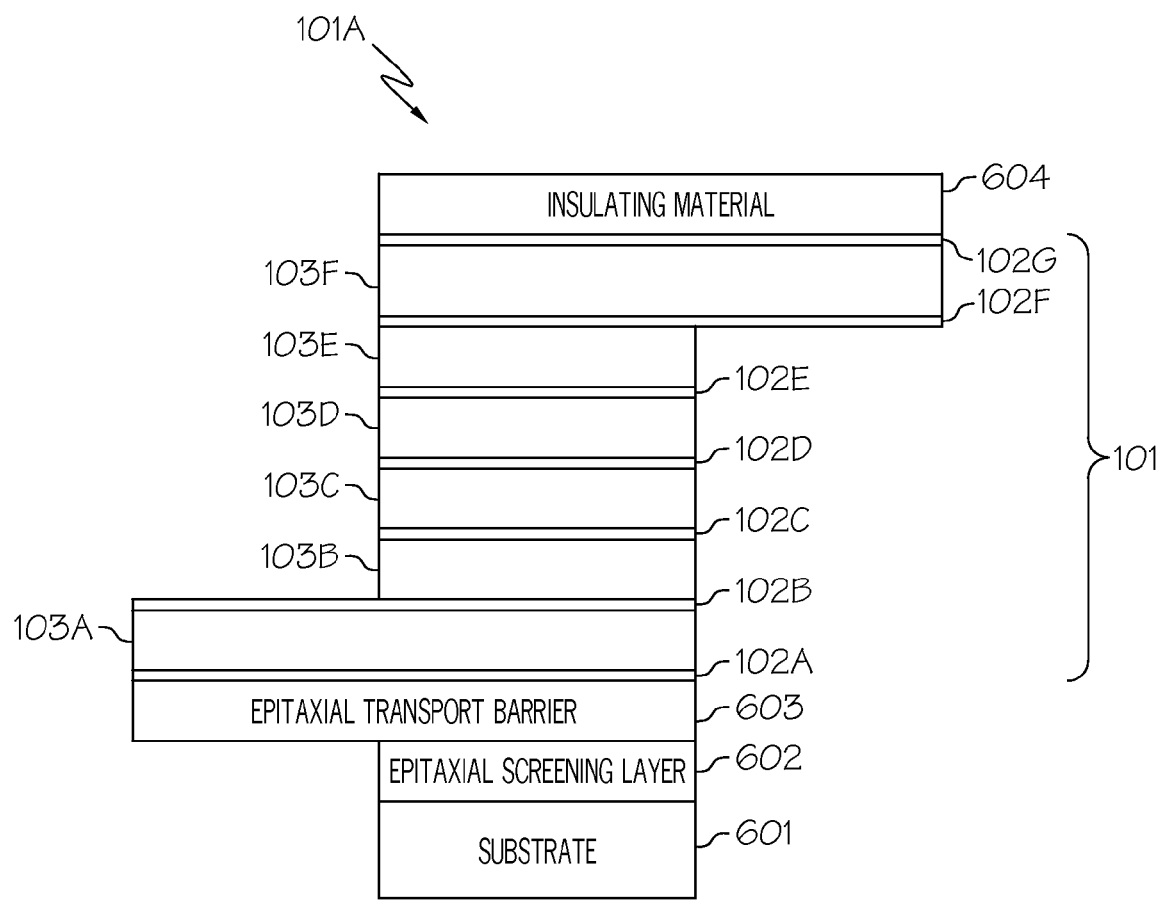

In step 505, the structure of semiconductor device 100A shown in FIG. 6D is etched and patterned to create a resonant tunneling structure 101 in the shape of a "step" as illustrated in FIG. 6E. It is noted that the shape of a "step" as used herein refers to the shape with the general configuration as depicted in FIG. 6E.

Figure 6F:
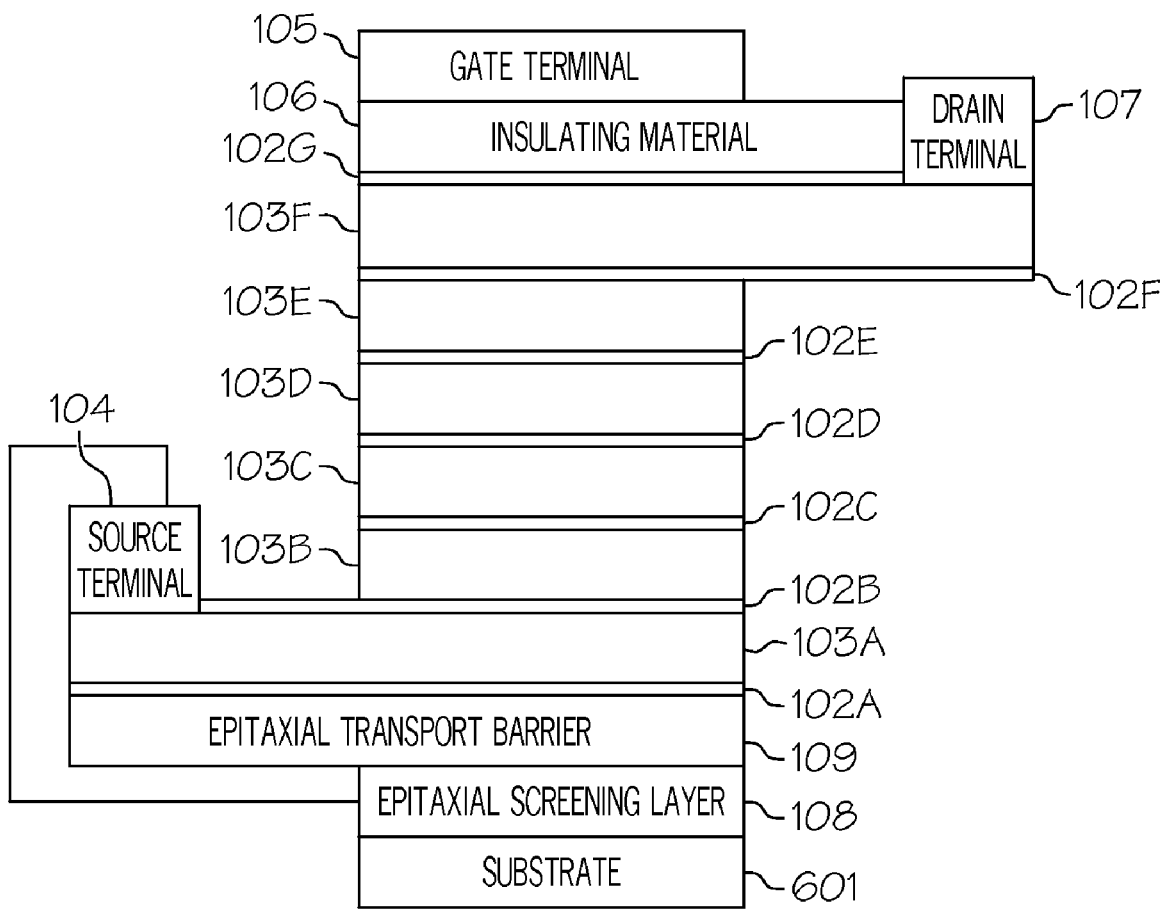

In step 506, contact holes are etched (epitaxial layer 602 becomes field screening layer 108) and gate 105, source 104 and drain 107 terminal electrodes are patterned and etched using known procedures in the art as illustrated in FIG. 6F. It is noted that FIG. 6F shows insulating layer 106 and charge transport barrier 109 of semiconductor device 100A as corresponding to insulating material layer 603 and charge transport barrier 604 of FIGS. 6B-E, respectively. In one embodiment, source terminal 104 is formed on the extension of quantum well 103A that serves as a source, gate terminal 105 is formed on insulating material 106 and drain terminal 107 is formed on the extension of quantum well 103F that serves as a drain.

Method 500 may include other and/or additional steps that, for clarity, are not depicted. Further, method 500 may be executed in a different order presented and that the order presented in the discussion of FIG. 5 is illustrative. Additionally, certain steps in method 500 may be executed in a substantially simultaneous manner or may be omitted.

The principles of the present invention in fabricating semiconductor device 100A of FIG. 1A as discussed in method 500 may be applied to fabricating the other semiconductor devices (e.g., semiconductor devices 100B-F) discussed herein. Furthermore, the principles of the present invention in fabricating semiconductor device 100A of FIG. 1A as discussed in method 500 may be applied to fabricating any semiconductor device where a resonant tunneling structure is able to provide greater gate control. Embodiments covering such permutations would fall within the scope of the present invention.

Although the method and the semiconductor device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

The invention claimed is:

1. A semiconductor device, comprising:
   a source terminal;
   a gate terminal;
   a drain terminal; and
   a resonant tunneling structure comprising a plurality of tunneling barrier layers and a plurality of quantum well layers, wherein a quantum well layer is formed between a set of two tunneling barrier layers, wherein said gate terminal is formed on a first tunneling barrier layer of a first quantum well layer of said resonant tunneling structure, wherein said source terminal is formed on a second tunneling barrier layer of a second quantum well layer of said resonant tunneling structure, wherein said resonant tunneling structure is located within a current conduction path, wherein said gate terminal comprises means for controlling an electrostatic potential drop through said resonant tunneling structure largely independent of drain voltage, wherein said gate terminal further comprises means for controlling a potential within a portion of a conduction channel immediately beneath said gate terminal.

2. The semiconductor device as recited in 1, wherein said resonant tunneling structure comprises one or more quantum dot wells imbedded within a tunneling barrier material.

3. The semiconductor device as recited in 1, wherein said resonant tunneling structure comprises one or more quantum wire wells imbedded within a tunneling barrier material.

4. The semiconductor device as recited in claim 1, wherein one or more of said plurality of quantum well layers and said plurality of tunneling barrier layers are doped.

5. The semiconductor device as recited in claim 1, wherein one or more of said plurality of quantum well layers and said plurality of tunneling barrier layers comprise III-V compound material systems.

6. The semiconductor device as recited in claim 1, wherein said source terminal is formed on an extension of said second quantum well layer of said resonant tunneling structure that serves as a source.

7. The semiconductor device as recited in claim 1, wherein said drain terminal is formed on an extension of said first quantum well layer of said resonant tunneling structure that serves as a drain.

8. The semiconductor device as recited in 1 further comprising:
   an electric-field screening layer located beneath said resonant tunneling structure.

9. The semiconductor device as recited in claim 8, wherein said electric-field screening layer comprises doped III-V compound semiconductor material.

10. The semiconductor device as recited in claim 8, wherein said electric-field screening layer comprises doped column IV semiconductor material.

11. The semiconductor device as recited in claim 8, wherein said electric-field screening layer comprises a semimetal.

12. The semiconductor device as recited in claim 8, wherein said electric-field screening layer comprises a metal.

13. The semiconductor device as recited in claim 8 further comprising:
   an initial transport barrier layer located between said electric-field screening layer and said resonant tunneling structure.

14. The semiconductor device as recited in claim 13, wherein said initial transport barrier layer is doped.

15. The semiconductor device as recited in claim 13, wherein said initial transport barrier layer comprises III-V compound semiconductor material.

16. The semiconductor device as recited in claim 1, wherein said gate terminal is formed on an insulating dielectric, wherein said insulating dielectric is formed on top of said resonant tunneling structure.

17. The semiconductor device as recited in claim 16, wherein said insulating dielectric comprises silicon dioxide.

18. The semiconductor device as recited in claim 16, wherein said insulating dielectric comprises high-k dielectrics.

19. The semiconductor device as recited in claim 1, wherein one or more of said plurality of quantum well layers support quasi-discrete electron or hole energy levels, wherein said semiconductor device comprises means for having an electron or a hole be tunneled through said resonant tunneling structure from said source terminal to said drain terminal when an energy of said electron or said hole is brought into resonance with energy levels of said one or more of said plurality of quantum well layers via an application of a gate terminal voltage.

20. The semiconductor device as recited in claim 1, wherein said semiconductor device comprises means for having said resonant tunneling structure produce a mini-band structure for transport of electrons or holes through said resonant tunneling structure during an ON state for the semiconductor device.

21. The semiconductor device as recited in claim 1, wherein said semiconductor device comprises means for having said resonant tunneling structure function as a high-order band pass filter for electrons or holes during an ON state for the semiconductor device.

22. The semiconductor device as recited in claim 1, wherein said semiconductor device comprises means for having said gate terminal eliminate inter-well resonances during an OFF state for the semiconductor device.

23. The semiconductor device as recited in claim 1, wherein said semiconductor device comprises means for having said gate terminal destroy a mini-band structure during an OFF state for the semiconductor device.

24. The semiconductor device as recited in claim 1, wherein said semiconductor device comprises means for having said gate terminal destroy a high-order band pass filter structure during an OFF state for the semiconductor device.

25. The semiconductor device as recited in claim 1, wherein said first tunneling barrier layer of said first quantum well layer of said resonant tunneling structure is a top tunneling barrier layer of said resonant tunneling structure.

26. The semiconductor device as recited in claim 1, wherein said second tunneling barrier layer of said second quantum well layer of said resonant tunneling structure is a top tunneling barrier layer of a bottom quantum well layer of said resonant tunneling structure.

27. The semiconductor device as recited in claim 1, wherein said first tunneling barrier layer of said first quantum well layer of said resonant tunneling structure is a top tunneling barrier layer of said resonant tunneling structure, wherein said second tunneling barrier layer of said second quantum well layer of said resonant tunneling structure is a top tunneling barrier layer of a bottom quantum well layer of said resonant tunneling structure.

28. The semiconductor device as recited in claim 27, wherein said drain terminal is formed on said second tunneling barrier layer of said second quantum well layer of said resonant tunneling structure.

29. The semiconductor device as recited in claim 27, wherein said drain terminal is formed on said first tunneling barrier layer of said first quantum well layer of said resonant tunneling structure.

* * * * *